United States Patent
Economy et al.

(10) Patent No.: US 12,087,358 B2
(45) Date of Patent: Sep. 10, 2024

(54) ACCESS LINE GRAIN MODULATION IN A MEMORY DEVICE

(71) Applicant: Micron Technology, Inc., Boise, ID (US)

(72) Inventors: David Ross Economy, Boise, ID (US); Stephen W. Russell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 69 days.

(21) Appl. No.: 17/236,700

(22) Filed: Apr. 21, 2021

(65) Prior Publication Data
US 2021/0312978 A1 Oct. 7, 2021

Related U.S. Application Data

(63) Continuation of application No. 16/102,494, filed on Aug. 13, 2018, now Pat. No. 10,991,425.

(51) Int. Cl.
  G11C 13/00 (2006.01)
  H10B 63/00 (2023.01)
  H10N 70/00 (2023.01)

(52) U.S. Cl.
  CPC .......... *G11C 13/003* (2013.01); *H10B 63/84* (2023.02); *H10N 70/021* (2023.02); *H10N 70/801* (2023.02)

(58) Field of Classification Search
  CPC . H01L 27/2481; H01L 45/12; H01L 45/1608; G11C 13/003; G11C 13/0004;
  (Continued)

(56) References Cited

U.S. PATENT DOCUMENTS 5,594,698 A  1/1997 Freeman
5,748,547 A  5/1998 Shau
(Continued)

FOREIGN PATENT DOCUMENTS

CN  101165888 A  4/2008
CN  104718576 A  6/2015
(Continued)

OTHER PUBLICATIONS

ISA/KR< International Search Report and Written Opinion of the International Searching Authority, Int'l Appl. No. PCT/US2020/063415, Mar. 18, 2021, Korean Intellectual Property Office, Seo-gu, Daejeon, Republic of Korea, 11pgs.
(Continued)

*Primary Examiner* — Victor A Mandala
*Assistant Examiner* — Colleen E Snow
(74) *Attorney, Agent, or Firm* — Holland & Hart LLP

(57) ABSTRACT

Methods, systems, and devices for access line grain modulation in a memory device are described. A memory cell stack in a cross-point memory array may be formed. In some examples, the memory cell stack may comprise a storage element. A barrier material may be formed above the memory cell stack. The barrier material may initially have an undulating top surface. In some cases, the top surface of the barrier material may be planarized. After the top surface of the barrier material is planarized, a metal layer for an access line may be formed on the top surface of the barrier material. Planarizing the top surface of the barrier material may impact the grain size of the metal layer. In some cases, planarizing the top surface of the barrier material may decrease the resistivity of access lines formed from the metal layer and thus increase current delivery throughout the memory device.

20 Claims, 7 Drawing Sheets

(58) Field of Classification Search
CPC .. G11C 13/0069; G06F 3/0679; H10N 70/801; H10N 70/021; H10B 63/84

See application file for complete search history.

(56) References Cited

U.S. PATENT DOCUMENTS

| | | | |
|---|---|---|---|
| 5,877,990 | A | 3/1999 | Kim |
| 6,225,226 | B1 | 5/2001 | Lee et al. |
| 9,012,319 | B1 | 4/2015 | Choi et al. |
| 9,530,737 | B1 | 12/2016 | Fu et al. |
| 9,577,010 | B2 | 2/2017 | Sciarrillo |
| 10,147,875 | B1 | 12/2018 | Hansen et al. |
| 10,374,039 | B1 * | 8/2019 | Hashemi ............ H01L 21/84 |
| 10,459,657 | B2 | 10/2019 | Maheshwari et al. |
| 10,629,652 | B2 | 4/2020 | Bernhardt et al. |
| 10,658,583 | B1 | 5/2020 | Li et al. |
| 10,854,674 | B2 | 12/2020 | Ravasio et al. |
| 11,121,317 | B2 | 9/2021 | Venigalla et al. |
| 11,373,695 | B2 | 6/2022 | Swami et al. |
| 2001/0046784 | A1 | 11/2001 | Broekaart et al. |
| 2003/0027386 | A1 | 2/2003 | Lee |
| 2003/0076725 | A1 | 4/2003 | Hush |
| 2003/0218907 | A1 | 11/2003 | Yano |
| 2004/0084670 | A1 | 5/2004 | Tripsas et al. |
| 2005/0064707 | A1 | 3/2005 | Sinha |
| 2008/0106323 | A1 | 5/2008 | Aipperspach et al. |
| 2010/0038616 | A1 | 2/2010 | Nagashima et al. |
| 2010/0054030 | A1 | 3/2010 | Lowrey |
| 2010/0211725 | A1 | 8/2010 | Nagashima et al. |
| 2010/0284230 | A1 | 11/2010 | Shin |
| 2011/0186797 | A1 | 8/2011 | Herner |
| 2012/0156871 | A1 | 6/2012 | Sinha |
| 2013/0069233 | A1 | 3/2013 | Chou et al. |
| 2013/0095634 | A1 | 4/2013 | Takahashi et al. |
| 2014/0071756 | A1 | 3/2014 | Iwai et al. |
| 2014/0104926 | A1 | 4/2014 | Sutardja et al. |
| 2014/0157065 | A1 | 6/2014 | Ong |
| 2014/0175580 | A1 | 6/2014 | Chen et al. |
| 2014/0254272 | A1 | 9/2014 | Sharon et al. |
| 2015/0064899 | A1 | 3/2015 | Ji et al. |
| 2015/0255532 | A1 | 9/2015 | Li |
| 2015/0287916 | A1 | 10/2015 | Campbell et al. |
| 2017/0117327 | A1 | 4/2017 | Terai |
| 2017/0162627 | A1 | 6/2017 | Bernasconi et al. |
| 2017/0236779 | A1 | 8/2017 | Komori |
| 2017/0256309 | A1 | 9/2017 | Yoon |
| 2018/0261266 | A1 | 9/2018 | Harris et al. |
| 2018/0358411 | A1 | 12/2018 | Fantini et al. |
| 2019/0043807 | A1 | 2/2019 | Redaelli et al. |
| 2019/0043924 | A1 | 2/2019 | Conti et al. |
| 2019/0206455 | A1 | 7/2019 | Bedeschi et al. |
| 2019/0355411 | A1 | 11/2019 | Subramanian et al. |
| 2020/0051624 | A1 | 2/2020 | Economy et al. |
| 2020/0243642 | A1 | 7/2020 | Fukuo |
| 2020/0266338 | A1 | 8/2020 | Peng et al. |
| 2020/0286822 | A1 | 9/2020 | Nishimura |
| 2020/0303300 | A1 | 9/2020 | Kato |
| 2020/0379655 | A1 | 12/2020 | Kajigaya |
| 2021/0013396 | A1 | 1/2021 | Wang et al. |
| 2021/0066394 | A1 | 3/2021 | Conti et al. |
| 2021/0091140 | A1 | 3/2021 | Ravasio et al. |

FOREIGN PATENT DOCUMENTS

| | | |
|---|---|---|
| CN | 106030842 A | 10/2016 |
| CN | 107078150 A | 8/2017 |
| CN | 107154274 A | 9/2017 |
| CN | 110660807 A | 1/2020 |
| JP | 2003-346485 A | 12/2003 |
| JP | 2006-505938 A | 2/2006 |
| JP | 2010-045205 A | 2/2010 |
| JP | 2012-235134 A | 11/2012 |
| JP | 2017-147337 A | 8/2017 |
| JP | 2019-515409 A | 6/2019 |
| JP | 2020-145311 A | 9/2020 |
| JP | 2020-155543 A | 9/2020 |
| JP | 2022-529568 A | 6/2022 |
| KR | 100881507 B1 | 2/2009 |
| KR | 10-2010-0055503 A | 5/2010 |
| WO | 2019/040304 A1 | 2/2019 |
| WO | 2019177632 A1 | 9/2019 |
| WO | 2019182657 A1 | 9/2019 |

OTHER PUBLICATIONS

Taiwan Intellectual Property Office, "Office Action," issued in connection with ROC (Taiwan) Patent Application No. 109143037, dated Sep. 10, 2021 (6 pages).

Chinese Patent Office, "Office Action", issued in connection with Chinese Patent Application No. 202080093244.2 dated Jan. 3, 2023 (10 pages) (4 pages of English Translation and 6 pages of Original Document).

Chinese Patent Office, "Office Action," issued in connection with Chinese Patent Application No. 201910735747.4 dated Mar. 20, 2023 (8 pages).

European Patent Office, "Supplementary European search report ," issued in connection with European Patent No. 20902537 dated Jan. 9, 2023 (7 pages).

International Search Report and Written Opinion received for PCT Patent Application No. PCT/US20/63414, mailed on Mar. 5, 2021, 7 pages.

Japan Patent Office, "Office Action," issued in connection with Japan Patent Application No. 2021-552543 dated Dec. 27, 2022 (11 pages) (6 pages of English Translation and 5 pages of Original Document).

Japanese Patent Office, "Office Action", issued in connection with Japanese Patent Application No. 2022-537274 dated Nov. 22, 2022 (15 pages) (8 pages of English Translation and 7 pages of Original Document).

Korean Patent Office, "Notice of Allowance," issued in connection with Korean Patent Application No. 10-2021-7028482 dated Aug. 1, 2023 (4 pages) (2 pages of English Translation and 2 pages of Original Document).

Chinese Patent Office, "Office Action," issued in connection with Chinese Patent Application No. 202110308268.1 dated Sep. 27, 2023 (14 pages total; 7 pages Original & 7 pages machine translation).

Japan Patent Office, "JP Decision to Grant," issued in connection with Japan Patent Application No. 2021-552543 dated Dec. 4, 2023 (5 pages) (2 pages of English Translation and 3 pages of Original Document).

Chinese patent office, "China Office Action," issued in connection with China Patent Application No. 202110308268.1 dated Mar. 13, 2024 (9 pages total; 6 pages original and 3 pages translation).

* cited by examiner

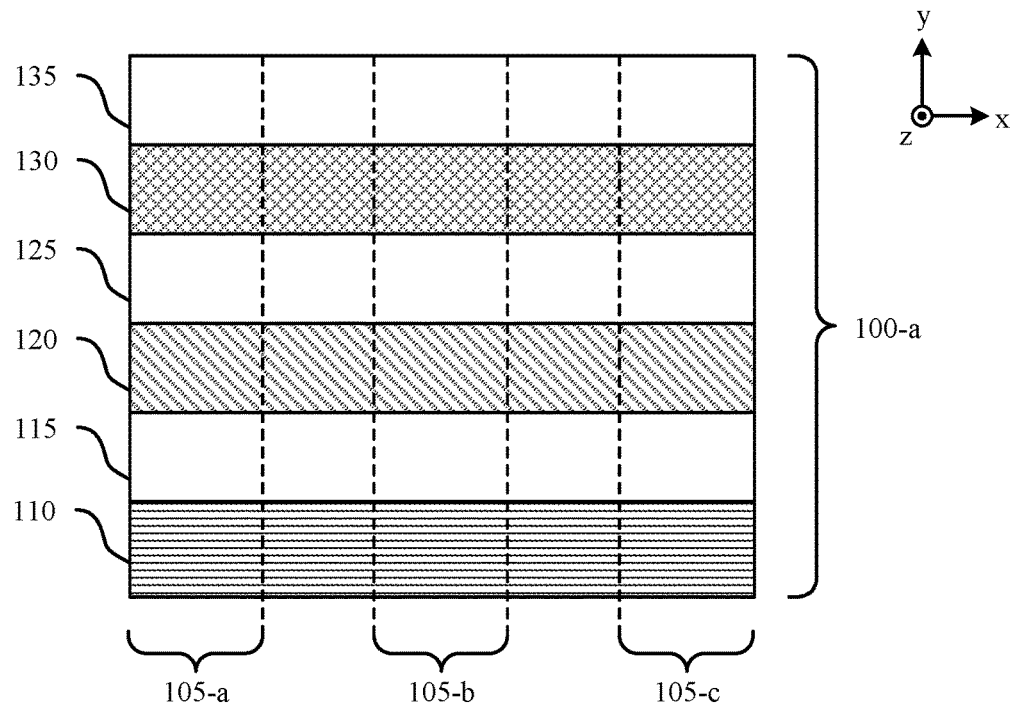
FIG. 1A
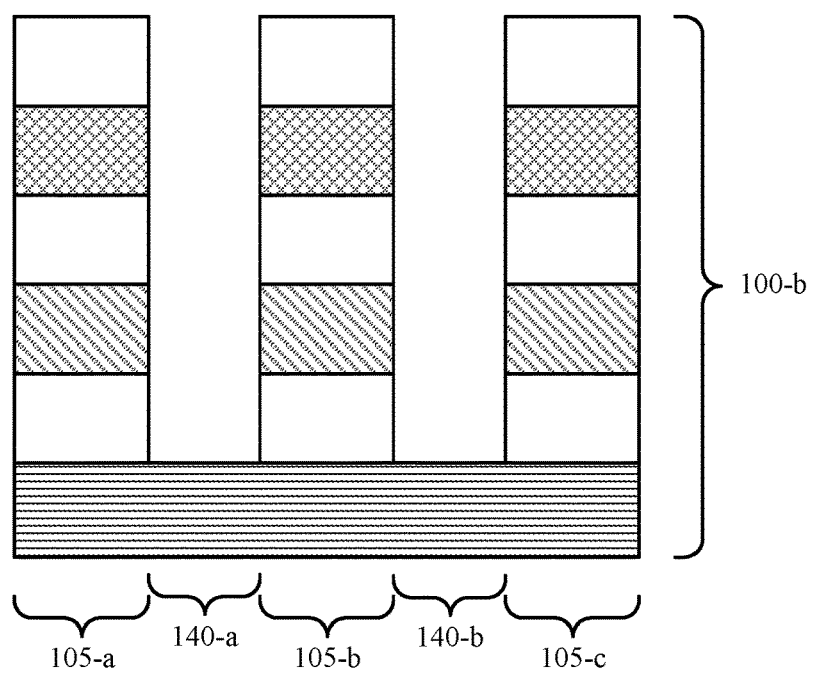
FIG. 1B
 Selector Material     Electrode Material
 Metal Layer     Storage Material

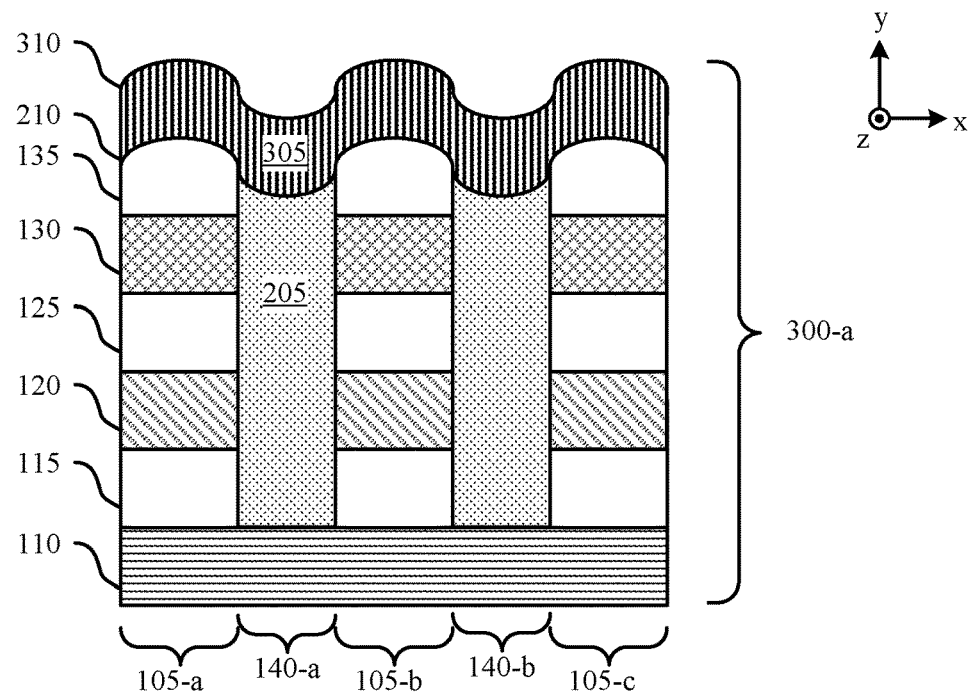
FIG. 3A
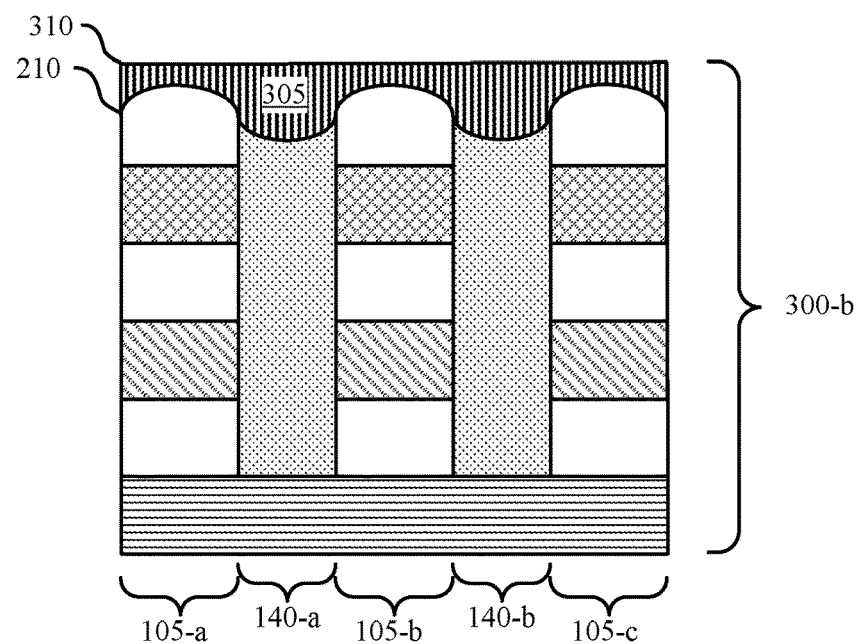
FIG. 3B
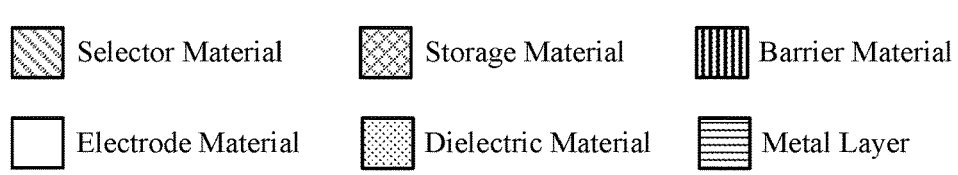

ACCESS LINE GRAIN MODULATION IN A MEMORY DEVICE

CROSS REFERENCE

The present Application for Patent is a continuation of and claims priority to and the benefit of U.S. patent application Ser. No. 16/102,494 by Economy et al., entitled "ACCESS LINE GRAIN MODULATION IN A MEMORY DEVICE," filed Aug. 13, 2018, assigned to the assignee hereof, and is expressly incorporated by reference in its entirety herein.

BACKGROUND

The following relates generally to fabricating a memory cell stack in a cross-point memory array and more specifically to methods for access line grain modulation in a memory device.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

In some memory devices, the electrical behavior of a memory device (e.g., resistivity of access lines) may depend at least in part on the topography of one or more components of the memory device. Solutions for improving (e.g., reducing variations in) the topography of a memory device may be desired.

BRIEF DESCRIPTION OF THE DRAWINGS

FIGS. 1A and 1B illustrate examples of fabrication techniques in accordance with embodiments of the present disclosure.

FIGS. 3A and 3B illustrate examples of fabrication techniques in accordance with embodiments of the present disclosure.

DETAILED DESCRIPTION

Figure 2A:
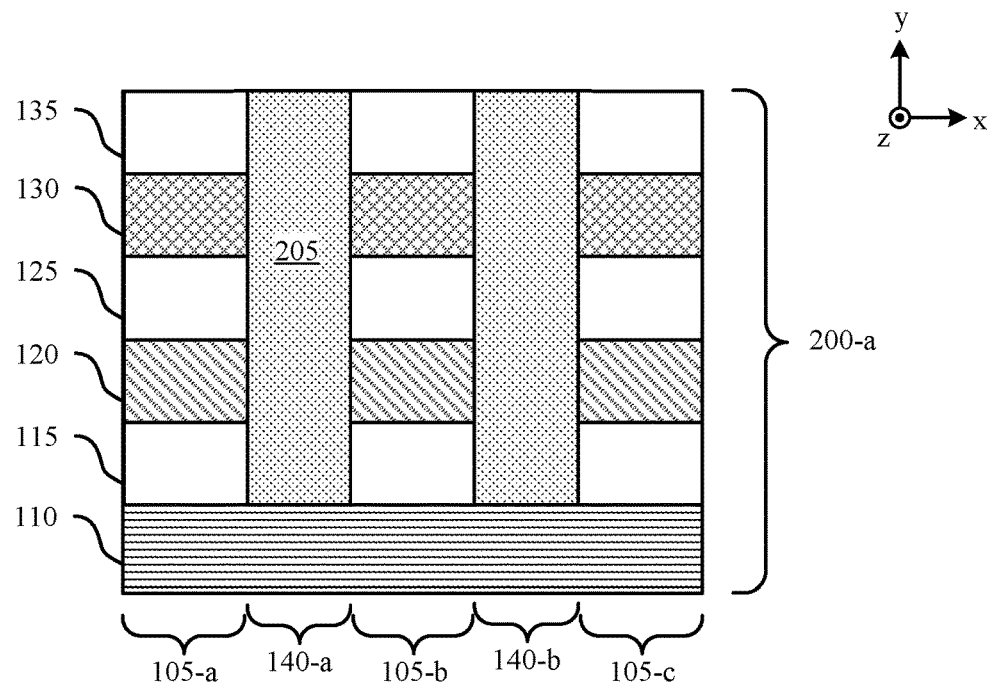
FIGS. 2A and 2B illustrate examples of fabrication techniques in accordance with embodiments of the present disclosure.

Some memory devices may be formed, at least in part, by forming a stack of various materials (e.g. a stack of materials may be formed and additional processing steps may be applied to the stack). In some cases, different layers of the stack may be formed sequentially, and thus the formation of the stack may involve forming an additional layer on top of a first layer of the stack. The structure of a top surface (e.g., a topography of the top surface) of the first layer may result in the additional layer having a similar structure (e.g., topography). For example, if the additional layer of the stack is formed in contact with a non-planar (e.g., undulating) top surface of the first layer, a non-planar or an undulating pattern of the first layer may propagate upwards to the additional layer, causing a non-planar or an undulating top surface in the additional layer as well.

The undulating top surface may impact the behavior of components that include one or both layers and/or components that include other layers above or on top of the undulating top surface of the additional layer. For example, the behavior of the material in a given layer or of the overall memory device (e.g., resistivity, current delivery, or both associated with a component of the memory device) may depend on (e.g., be impacted by) the presence of an undulating top surface of the additional layer. Thus, minimizing the undulations of one or more layers may improve the performance of the memory device for certain implementations.

In accordance with the teachings herein, fabricating a memory cell may include planarizing (e.g., polishing or otherwise smoothing) a layer prior to forming a next layer. For example, a barrier material may be fabricated using techniques that initially result in an undulating top surface of the barrier material (e.g., a top surface that is wavy or otherwise uneven in thickness or topography). In some cases, the barrier material may be planarized prior to forming a metal layer above the barrier material. Planarizing the barrier material prior to the metal layer formation may cause the resulting metal layer to lack or at least have reduced undulations (relative to undulations that may have existed in the metal layer had it been formed without an intermediate planarizing step of the barrier material). Therefore, the metal layer may have more predictable and uniform behavior or otherwise more desirable behavior.

For example, the grain size of the metal layer may increase, resulting in a decrease in resistivity in access lines formed from the metal layer and an increase in current delivery throughout the memory device. Increasing the grain size of the metal layer by planarizing the top surface of the barrier material may also reduce the complexity of memory device formation (e.g., the complexity of etch steps due a reduced amount of metal used to form access lines). These and other fabrication techniques described herein may thus improve the behavior and performance of memory cells and have other benefits which may be appreciated by those of ordinary skill in the art.

Features of the disclosure introduced above are further described below in the context of the example fabrication techniques of FIGS. 1-4. These and other features of the disclosure are further illustrated by and described with reference to the example memory array of FIG. 5 and the flowcharts of FIGS. 6 and 7 that relate to the fabrication of memory cells.

Various techniques may be used to form materials or components shown in FIGS. 1-5 below. These may include, for example, chemical vapor deposition (CVD), metal-organic vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization (CMP).

FIGS. 1A and 1B are schematic depictions of intermediate memory array structures illustrating a method of fabricating a memory cell stack at various stages of fabrication.

Referring to FIG. 1A, according to some examples, an intermediate array structure 100-a may include aspects of a cell stack that will be processed to eventually form a first memory cell stack 105-a, a second memory cell stack 105-b, and a third memory cell stack 105-c, as further detailed below. In some cases, the regions including the first memory cell stack 105-a, the second memory cell stack 105-b, and the third memory cell stack 105-c may eventually be configured (e.g., fabricated) to include three distinct memory cells (e.g., storage components within the memory cell stack 105). Thus, the data stored in the first memory cell may be independent of the data stored in the second and third memory cell, the data stored in the second memory cell may be independent of the data stored in the first and third memory cell, and the data stored in the third memory cell may be independent of the data stored in the first and second memory cell.

Although three memory cell stacks 105-a, 105-b, and 105-c are shown, one of ordinary skill will appreciate that, in practice, any number of memory cell stacks 105 may be formed. In some cases, fabricating the memory cell stacks 105 may include forming a metal layer 110 over a substrate (not shown). Metal layer 110 may be used to form one or more access lines, for example a word line or a bit line for a memory cell included in a memory cell stack 105.

In some cases, fabricating the memory cell stacks 105 may include forming a first electrode material 115 over metal layer 110. The first electrode material 115 may be used to form one or more bottom electrode components, for example bottom electrodes respectively corresponding to memory cell stacks 105-a, 105-b, and 105-c.

The method may include forming a selector material 120 over the first electrode material 115. The selector material 120 may be used to form one or more selection components, for example selector components respectively corresponding to memory cell stacks 105-a, 105-b, and 105-c. In some cases, the selector material 120 may comprise a chalcogenide material.

The method may include forming a second electrode material 125 over the selector material 120. The second electrode material 125 may be used to form one or more middle electrode components, for example middle electrodes respectively corresponding to memory cell stacks 105-a, 105-b, and 105-c.

The method may include forming a storage material 130 over the second electrode material 125. The storage material 130 may be used to form one or more storage components, for example storage components respectively corresponding to memory cell stacks 105-a, 105-b, and 105-c. In some cases, the storage material 130 may comprise a chalcogenide material. The storage material 130 may be the same as or different than the selector material 120. Also, though the example of intermediate array structure 100-a illustrates the storage material 130 as above the selector material 120, the positions of the storage material 130 and selector material 120 may be swapped in some examples. Further, in some examples, a memory cell stack 105 and corresponding memory cell stack may lack a separate selector material 120 and the second electrode material 125, and the storage material 130 may be self-selecting.

The method may include forming a third electrode material 135 over the storage material 130. The third electrode material 135 may be used to form one or more top electrode components, for example top electrodes respectively corresponding to memory cell stacks 105-a, 105-b, and 105-c.

Electrode materials 115, 125, and 135 may each include carbon. In some cases, on or more of electrode materials 115, 125, and 135 may consist of two sub-layers (not shown), and thus an electrode formed therefrom may be referred to as a bi-layer electrode. In this case, at least one sub-layer may include carbon and may be referred to as a carbon-based material. Electrode materials 115, 125, and 135 may be formed, for example, by deposition techniques such as PVD, CVD, or ALD, among other deposition techniques.

Each layer of intermediate array structure 100-a may be initially formed as a blanket layer over the surface area of an entire die or substrate, such as a wafer.

Referring now to intermediate array structure 100-b of FIG. 1B, isolation regions 140-a and 140-b may be formed between memory cell stacks 105-a and 105-b and/or 105-b and 105-c so as to separate and isolate the memory cell stacks 105 from one another. Isolation regions 140-a and 140-b may be formed using various etching or other removal techniques, which may use photomasks and photolithography to define the features as necessary.

FIG. 1B illustrates a cross-section of intermediate array structure 100-b in one plane (e.g., an x-z plane) and thus shows isolation regions 140-a and 140-b as separating memory cell stacks 105-a, 105-b, and 105-c in one dimension (e.g., the x dimension), but one of ordinary skill in the art will appreciate that like techniques may be applied in another plane (e.g., a y-z plane) so as to separate memory cell stacks 105-a, 105-b, and 105-c and the corresponding memory cell stacks in another dimension (e.g., the y dimension) such that the memory cell stacks corresponding to memory cell stacks 105-a, 105-b, and 105-c may each comprise a pillar. Further, one of ordinary skill in the art will appreciate that, in some cases, what may appear as separate isolation regions 140-a and 140-b in FIG. 1B may be conjoined in a different plane and thus may comprise one contiguous isolation region 140 in some alternatives.

Figure 2B:
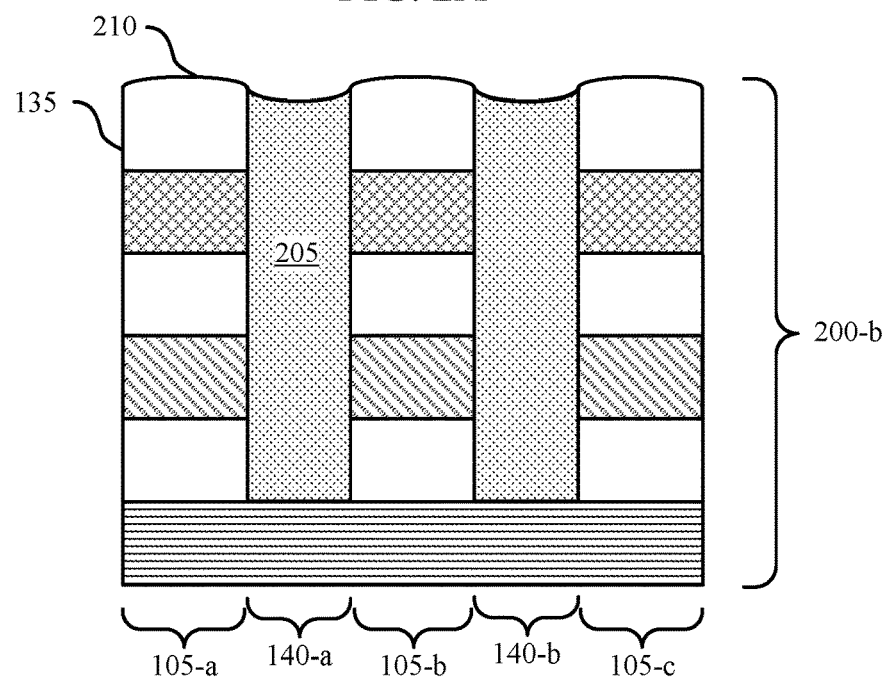

FIGS. 2A and 2B are schematic depictions of additional intermediate memory array structures illustrating a method of fabricating a memory cell stack.

Fabricating intermediate array structure 200-a of FIG. 2A may include depositing dielectric material 205. For example, isolation regions 140-a and 140-b may be filled with dielectric material 205. Thus, dielectric material 205 may be deposited and interposed between separate memory cell stacks. In that case, dielectric material 205 may surround one or more memory cell stacks 105.

Fabricating intermediate array structure 200-b of FIG. 2B may include forming an undulating surface 210. In some examples, undulating surface 210 may be referred to as a "wrap" topography and may be formed above third electrode material 135 and dielectric material 205. For example, undulating surface 210 may extend across at least some if not all of memory cell stacks 105-a, 105-b, and 105-c and isolation regions 140-a and 140-b. The wrap topography, which may be replicated in one or more layers above undulating surface 210, may in some cases improve the structural stability of memory cell stacks 105 and other aspects the memory array.

In some cases, undulating surface 210 may be formed by polishing or etching a top surface of third electrode material 135 and a top surface of dielectric material 205. In some examples, polishing or etching the top surface of third electrode material 135 and the top surface of dielectric material 205 may remove the third electrode material 135 and the dielectric material 205 at different rates. For example, the dielectric material 205 may be removed at a greater (faster) rate than the third electrode material 135, which may result in the undulating surface 210. Thus, in some examples, undulating surface 210 may be formed by removing third electrode material 135 at a first rate and/or removing dielectric material 205 at a second rate different than the first rate.

In certain examples, the undulating surface 210 may be formed by applying a CMP process to the top surface of the third electrode material 135 and dielectric material 205. In some cases, polishing the top surface of the third electrode material 135 may include breaking a vacuum seal associated with the deposition process. In this case, the third electrode material 135 may come to include oxidized carbon, as polishing intermediate array structure 200-b outside a vacuum environment may expose the top of the third electrode material 135 and dielectric material 205 to oxygen and/or the polishing process itself may introduce oxidation. In some other cases, fabricating the memory cell stack may not include the polishing of the third electrode material 135 and dielectric material 205, and the third electrode material 135 may not include oxidized carbon.

FIGS. 3A and 3B are schematic depictions of additional intermediate memory array structures illustrating a method of fabricating a memory cell stack with a barrier material 305. In some cases, barrier material 305 may be formed over the third electrode material 135 and the dielectric material 205 of intermediate array structure 300-a.

Intermediate array structure 300-a of FIG. 3A illustrates a deposition of barrier material 305 above the upper surface of the third electrode material 135 and above the upper surface of the dielectric material 205—that is, a deposition of barrier material 305 above the undulating surface 210 described with reference to FIG. 2B. In some cases, barrier material 305 may be in direct contact with third electrode material 135 and dielectric material 205. Various techniques may be used to deposit barrier material 305. These may include, but are not limited to, PVD, CVD, MOCVD, sputter deposition, ALD, or MBE, among other thin film growth techniques. In some cases, barrier material 305 may comprise a metal nitride such as tungsten nitride (WN), a metal silicide such as tungsten silicide (WSix), or a metal silicon nitride such as tungsten silicon nitride (WSiN). In some examples, barrier material 305 may be an example of a thermal barrier between the carbon of third electrode material 135 and a layer deposited on top of barrier material 305 (e.g., a metal layer as discussed below in further detail).

As initially formed, barrier material 305 may include a top surface 310 that is undulating. For example, barrier material 305 may be deposited on top of undulating surface 210. In some examples, as initially formed, barrier material 305 may include a uniform thickness in memory cell stacks 105-a, 105-b, and 105-c and isolation regions 140-a and 140-b and thus may include a top surface 310 with a similar undulating pattern as a bottom undulating surface (e.g., undulating surface 210) of barrier material 305.

Although not shown for clarity and ease of illustration, it will be understood that in some cases the illustrated array structures may also include a liner material deposited below barrier material 305. For example, the liner material may be interposed between a bottom surface of barrier material 305 and the top surface of third electrode material 135 and the top surface of dielectric material 205 (e.g., between a bottom surface of barrier material 305 and the undulating surface 210).

As illustrated in intermediate array structure 300-b of FIG. 3B, in some examples, the top surface 310 of barrier material 305 may be planarized or otherwise smoothened. Various techniques may be used to planarize top surface 310 of barrier material 305. These may include, but are not limited to, chemical etching, plasma etching, or polishing (e.g., CMP).

In some examples, processing the top surface 310 may change barrier material 305 from having a uniform thickness to having a varied thickness. For example, the thickness (e.g., a second thickness) of barrier material 305 in a region disposed above (e.g., overlapping with) a memory cell stack 105-a (e.g., second region or second type of region) may be less than the thickness (e.g., first thickness) of barrier material 305 in a region disposed above (e.g., overlapping with) an isolation region 140-a (e.g., first region). In some examples, the thickness of barrier material 305 may not impact the performance of the memory device so long as an interface corresponding to undulating surface 210 is maintained. For example, the lack of a thickness requirement or constraint may allow for flexibility in the planarization process, as discussed in reference to FIG. 3B.

Figure 4:
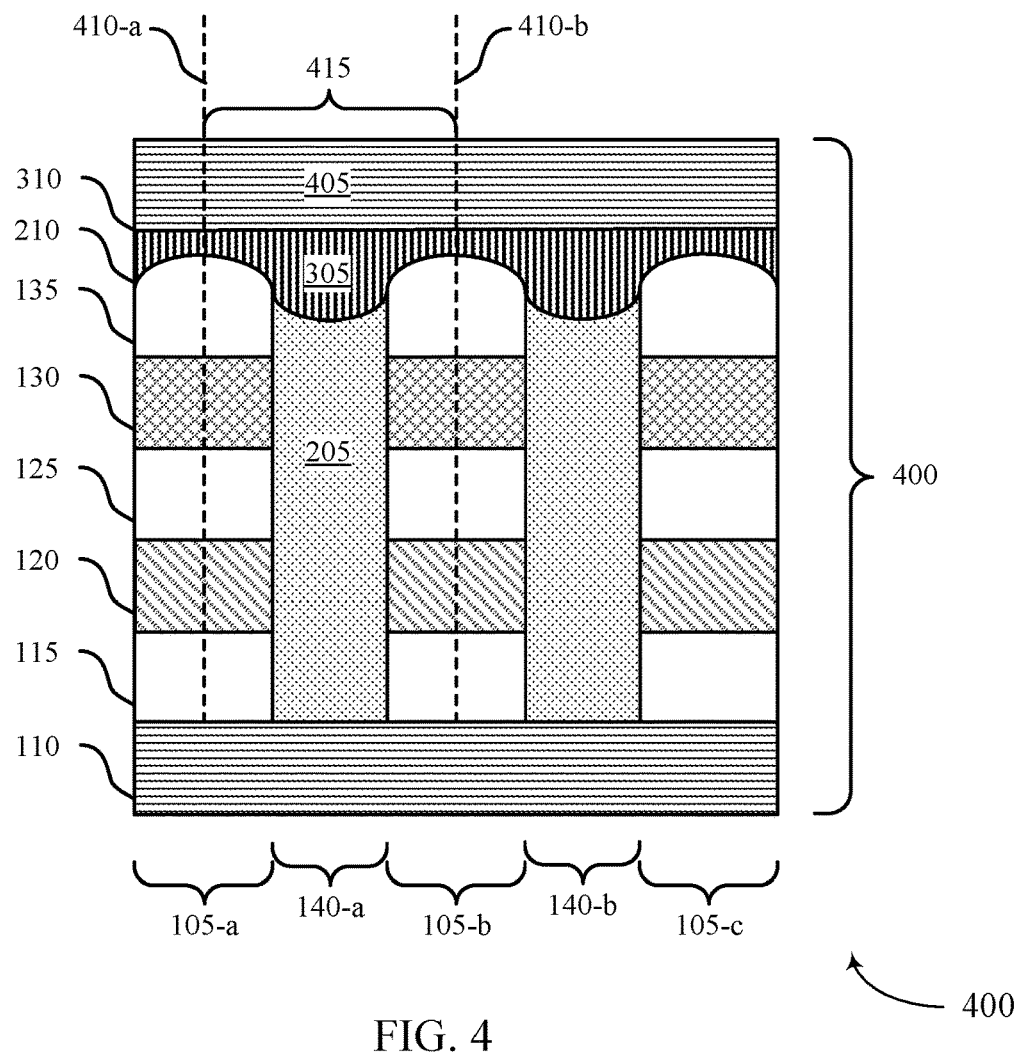
FIG. 4 illustrates an example of fabrication techniques in accordance with embodiments of the present disclosure.

FIG. 4 may be a schematic depiction of an additional intermediate memory array structure 400 illustrating a method of fabricating a memory cell stack with a metal layer 405. In some cases, the metal layer 405 may be formed over the barrier material 305 of intermediate array structure 400. In some cases, metal layer 405 may be in direct contact with top surface 310 (which may have been planarized or otherwise smoothened as described herein) of barrier material 305.

Intermediate array structure 400 of FIG. 4 illustrates a deposition of the metal layer 405 on a top surface 310 of barrier material 305. Various techniques may be used to deposit the metal layer 405. These may include, but are not limited to, PVD, CVD, MOCVD, sputter deposition, ALD, or MBE, among other thin film growth techniques. In some cases, metal layer 405 may be an example of an access line (e.g., word line, bit line, etc.). For example, metal layer 405 may comprise a refractory metal such as tungsten, tantalum, or molybdenum. In some cases, barrier material 305 (e.g., comprising WN, WSix, or WSiN) may provide reset current benefits or other benefits when deposited between third electrode material 135 (e.g., comprising carbon) and metal layer 405 (e.g., comprising tungsten, tantalum, or molybdenum).

In some cases, memory cell stack 105-a may include a center point 410-a and memory cell stack 105-b may include a center point 410-b. Center point 410-a and center point 410-b may be an example of a center of a memory cell stack. Distance 415 may be an example of a distance between center point 410-a and center point 410-b. For example, distance 415 may be an example of a cell pitch distance.

In some cases, absent planarization or other smoothening of metal layer 405, metal layer 405 may have an average grain size that substantially corresponds to (e.g., is substantially equal to) distance 415. For example, absent planarization or other smoothening of metal layer 405, the average grain size of metal layer 405 may substantially correspond to the topography of undulating surface 210, which may in turn substantially correspond to distance 415.

Where top surface 310 of barrier material 305 is planarized or otherwise smoothened as described herein, however, metal layer 405 may have an average grain size greater than distance 415 (e.g., greater than twice distance 415). For example, where top surface 310 of barrier material 305 is planarized or otherwise smoothened as described herein, a grain size of metal layer 405 may approach or be substantially equal to that observed for a blanket film deposition of the metal material included in metal layer 405 (e.g., approximately 250 nm or in some cases up to 300 nm or 350 nm, where metal layer 405 comprises tungsten, tantalum, or molybdenum). In some cases, increasing the average grain size in metal layer 405 may result in decreased resistance for access lines in the memory device, increased current delivery, and opportunities to reduce the thickness of metal layer 405. In some cases, planarizing top surface 310 of barrier material 305 may reduce the etch complexity of the memory device (e.g., as metal layer 405 may be formed using a decreased amount of metal) and increase structural yield of the memory device.

Although not shown for clarity and ease of illustration, it will be understood that the illustrated array structures may be formed above or below other layers (e.g., over a substrate), which can include, among other things, various peripheral and supporting circuitry. For example, complementary metal oxide semiconductor (CMOS) transistors may be incorporated into column and row driver circuitry and sense amplifier circuitry, as well as sockets and wiring that connect such circuitry to the memory array through the columns and rows described above. In addition, the other layers may include one or more memory arrays, or "decks" of arrays—the structures illustrated in the examples of FIGS. 1-4 may correspond to one deck of a memory array and may be above or below any number of additional decks of the memory array.

Although not shown for clarity and ease of illustration, it will be understood that the illustrated array structures may also include a conformal liner deposited adjacent to dielectric material 205 (e.g., in contact with dielectric material 205). For example, the conformal liner may be interposed between a side surface of dielectric material 205 and a side surface of the memory cell stack.

Figure 5:
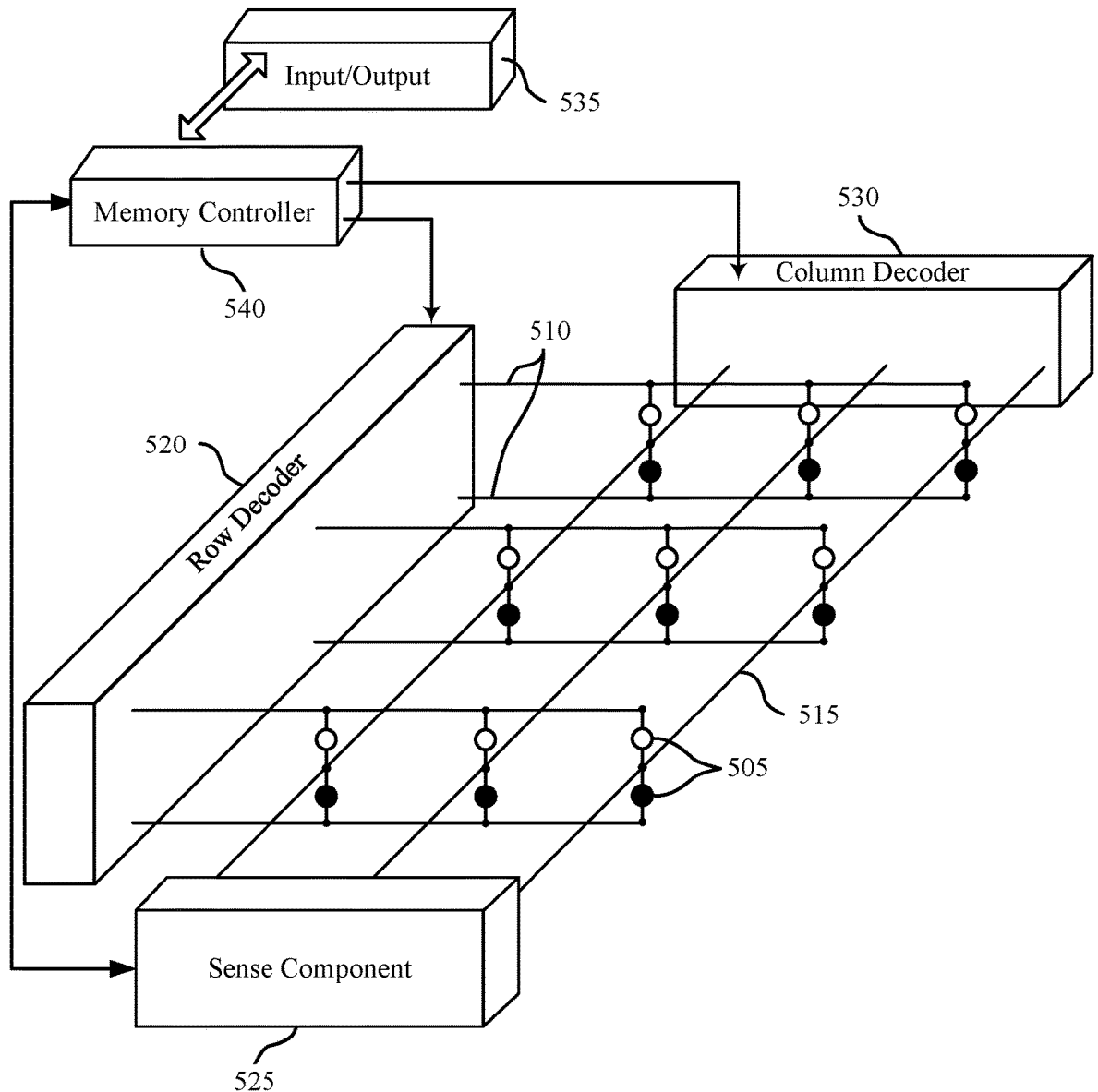
FIG. 5 illustrates an example memory array that supports access line grain modulation in a memory device in accordance with examples of the present disclosure.

FIG. 5 illustrates an example memory array 500 that supports access line grain modulation in a memory device in accordance with various examples of the present disclosure. Memory array 500 may also be referred to as an electronic memory apparatus. Memory array 500 includes memory cell stacks 505 that are programmable to store different states. Each memory cell stack 505 may include on or more memory cells. In some cases, a memory cell stack 505 may be programmable to store one of two states, denoted a logic "0" and a logic "1." In some cases, a memory cell stack 505 may be configured to store one of more than two logic states. Memory cell stacks 505 may be examples of a memory cell stack 105 as described in reference to FIGS. 1-4.

Memory array 500 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 5, memory array 500 includes two levels of memory cell stacks 505 and may thus be considered a three-dimensional memory array; however, the number of levels is not limited to two. Each level may be aligned or positioned so that memory cell stacks 505 may be approximately aligned with one another across each level.

Each row of memory cell stacks 505 is connected to an access line 510 and an access line 515. Access lines 510 and access lines 515 may be examples of or formed from corresponding metal layers 110 or metal layers 405, as described in reference to FIGS. 1-4. Access lines 510 and access lines 415 may also be known as word lines 510 and bit lines 515, respectively. Bit lines 515 may also be known digit lines 515. References to word lines and bit lines, or their analogues, are interchangeable without loss of understanding or operation.

Word lines 510 and bit lines 515 may be substantially perpendicular to one another to create an array. The two memory cell stacks 505 may share a common conductive line such as a digit line 515. That is, a digit line 515 may be in electronic communication with the bottom electrode of the upper memory cell stack 505 and the top electrode of the lower memory cell stack 505. Accordingly, in some cases a single access line 510, 515 may function as a word line 510 for a first group of one or more memory cell stacks 505 (e.g., a group of one or more memory cell stacks 505 below the access line 510, 515) and may function as a bit line 515 for a second group of one or more memory cell stacks 505 (e.g., a group of one or more memory cell stacks 505 above the access line 510, 515). Other configurations may be possible; for example, memory cell stack 505 may include asymmetrical electrode interfaces with the memory storage element. In some examples, the grain size of the access lines 510 and 515 may be increased by planarizing the top surface of a barrier material within the memory cell stack 505, as described herein, including with reference to FIGS. 1-4.

In general, one memory cell stack 505 may be located at the intersection of two conductive lines such as a word line 510 and a digit line 515. This intersection may be referred to as a memory cell's address. A target memory cell stack 505 may be a memory cell stack 505 located at the intersection of an energized word line 510 and digit line 515; that is, a word line 510 and digit line 515 may be energized in order to read or write a memory cell included in a memory cell stack 505 at their intersection. Other memory cell stacks 505 that are in electronic communication with (e.g., connected to) the same word line 510 or digit line 515 may be referred to as untargeted memory cell stacks 505.

As discussed above, electrodes (e.g., third electrode material 135 and first electrode material 115) may be coupled to a memory cell stack 505 and a word line 510 or a digit line 515, respectively. The term electrode may refer to an electrical conductor, and in some cases, may be employed as an electrical contact to a memory cell stack 505. An electrode may include a trace, wire, conductive line, conductive layer, or the like that provides a conductive path between elements or components of memory array 500.

Operations such as reading and writing may be performed on memory cell stacks 505 by activating or selecting a word line 510 and digit line 515, which may include applying a voltage or a current to the respective line. Word lines 510 and bit lines 515 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds.

Accessing memory cell stacks 505 may be controlled through a row decoder 520 and a column decoder 530. For example, a row decoder 520 may receive a row address from the memory controller 540 and activate the appropriate word line 510 based on the received row address. Similarly, a column decoder 530 receives a column address from the memory controller 540 and activates the appropriate digit line 515. Thus, by activating a word line 510 and a digit line 515, a memory cell stack 505 may be accessed.

Upon accessing, a memory cell stack 505 may be read, or sensed, by sense component 525. For example, sense component 525 may be configured to determine the stored logic state of memory cell stack 505 based on a signal generated by accessing memory cell stack 505. The signal may include a voltage or electrical current, and sense component 525 may include voltage sense amplifiers, current sense amplifiers, or both. For example, a voltage may be applied to a memory cell stack 505 (using the corresponding word line 510 and digit line 515) and the magnitude of the resulting current may depend on the electrical resistance of the memory cell stack 505, which may reflect the logic state stored by the memory cell stack 505. Likewise, a current may be applied to a memory cell stack 505 and the magnitude of the voltage to create the current may depend on the electrical resistance of the memory cell stack 505, which may reflect the logic state stored by the memory cell stack 505. Sense component 525 may include various transistors or amplifiers in order to detect and amplify a signal, which may be referred to as latching. The detected logic state of memory cell stack 505 may then be output as output 535. In some cases, sense component 525 may be a part of column decoder 530 or row decoder 520. Or, sense component 525 may be connected to or in electronic communication with column decoder 530 or row decoder 520.

The memory controller 540 may control the operation (read, write, re-write, refresh, discharge, etc.) of memory cell stacks 505 through the various components, for example, row decoder 520, column decoder 530, and sense component 525. In some cases, one or more of the row decoder 520, column decoder 530, and sense component 525 may be co-located with the memory controller 540. Memory controller 540 may generate row and column address signals in order to activate the desired word line 510 and digit line 515. Memory controller 540 may also generate and control various voltages or currents used during the operation of memory array 500. For example, it may apply discharge voltages to a word line 510 or digit line 515 after accessing one or more memory cell stacks 505.

In general, the amplitude, shape, or duration of an applied voltage or current discussed herein may be adjusted or varied and may be different for the various operations discussed in operating memory array 500. Furthermore, one, multiple, or all memory cell stacks 505 within memory array 500 may be accessed simultaneously; for example, multiple or all cells of memory array 100 may be accessed simultaneously during a reset operation in which all memory cell stacks 505, or a group of memory cell stacks 505, are set to a single logic state.

Figure 6:
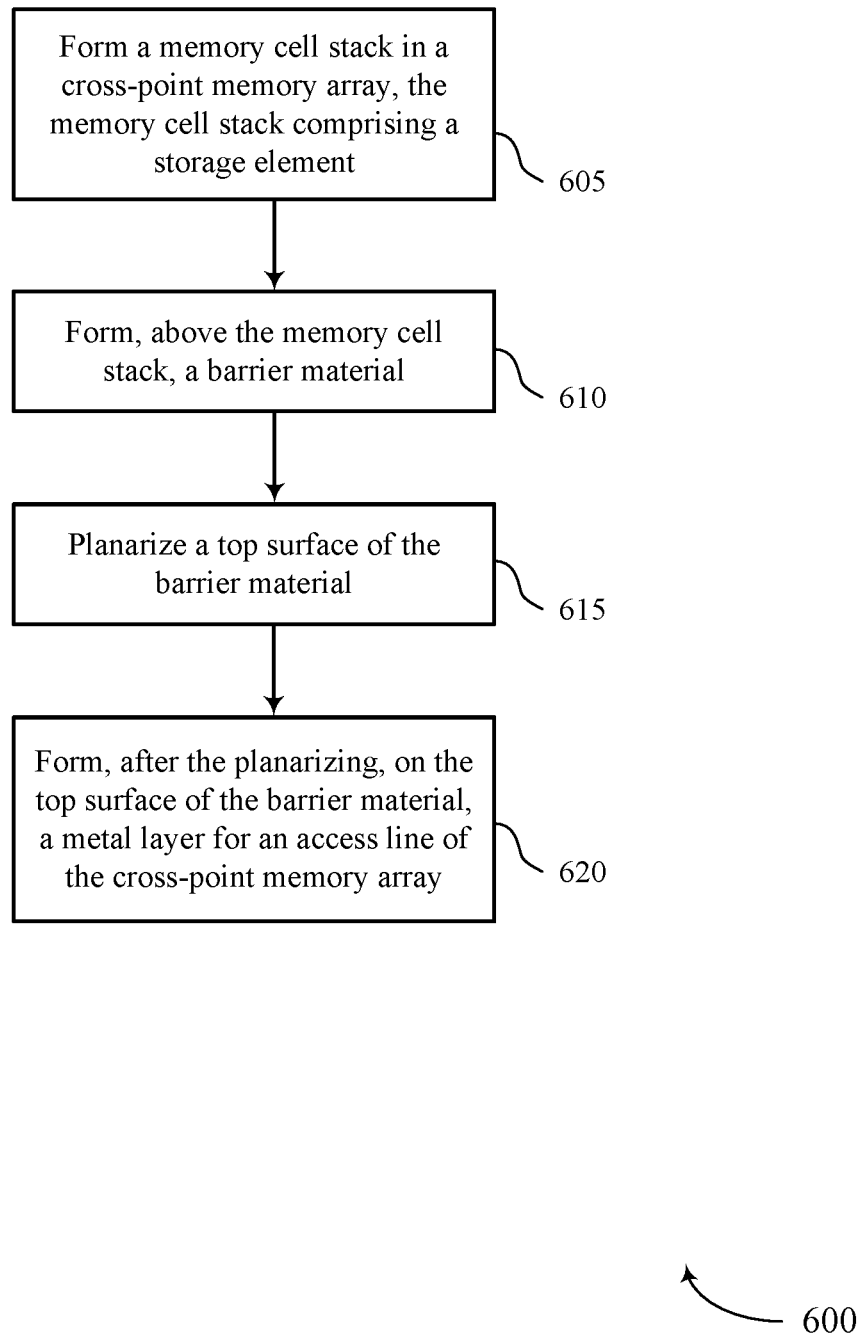
FIGS. 6 and 7 illustrate a method or methods for the access line grain modulation in a memory device in accordance with embodiments of the present disclosure.

FIG. 6 shows a flowchart illustrating a method 600 for access line grain modulation in a memory device in accordance with embodiments of the present disclosure. The operations of method 600 may be implemented in accordance with various fabrication techniques as described herein. For example, the operations of method 600 may be implemented by the fabrication techniques as discussed with reference to FIGS. 1-5.

At 605 a memory cell stack in a cross-point memory array may be formed. The memory cell stack may comprise a storage element. The operations of 605 may be performed according to the methods described herein. In certain examples, aspects of the operations of 605 may be performed using the fabrication techniques discussed with reference to FIGS. 1-5.

At 610 a barrier material may be formed above the memory cell stack. The operations of 610 may be performed according to the methods described herein. In certain examples, aspects of the operations of 610 may be performed using the fabrication techniques discussed with reference to FIGS. 1-5.

At 615 a top surface of the barrier material may be planarized. The operations of 615 may be performed according to the methods described herein. In certain examples, aspects of the operations of 615 may be performed using the fabrication techniques discussed with reference to FIGS. 1-5.

At 620 a metal layer for an access line of the cross-point memory array may be formed. In some cases, the metal layer may be formed on the top surface of the barrier material after the planarizing. In certain examples, aspects of the operations of 620 may be performed using the fabrication techniques discussed with reference to FIGS. 1-5.

In some examples, an apparatus may perform aspects of the fabrication described above using general-purpose or special-purpose hardware. The apparatus may include features, means, or instructions for forming a memory cell stack in a cross-point memory array, the memory cell stack comprising a storage element. The apparatus may further include features, means, or instructions for forming, above the memory cell stack, a barrier material. The apparatus may also include features, means, or instructions for planarizing a top surface of the barrier material. The apparatus may additionally include features, means, or instructions for forming, on the top surface of the barrier material, a metal layer for an access line of the cross-point memory array.

In some examples of the method and apparatus described above, planarizing the top surface of the barrier material may include applying a CMP process to the top surface of the barrier material. In some examples of the method and apparatus, forming the barrier material may include depositing the barrier material via a PVD process, a CVD process, an ALD process, or any combination thereof. In some cases, forming the memory cell stack may include forming an electrode layer, wherein the electrode layer comprises carbon. In some cases, forming the electrode layer may include depositing the electrode layer a PVD process, a CVD process, an ALD process, or any combination thereof.

Some examples of the method and apparatus described above may further include processes, features, means, or instructions for removing at least a portion of the electrode layer. In some examples of the method and apparatus described above, the metal layer is in contact with the top surface of the barrier material. In some cases, forming the memory cell stack may include depositing a dielectric material, wherein the dielectric material is interposed between the memory cell stack and a second memory cell stack. Some examples of the method and apparatus described above may further include processes, features, means, or instructions for removing a portion of the dielectric material and a portion of an electrode layer of the memory cell stack.

In some examples of the method and apparatus described above, removal of the electrode layer occurs at a first rate and removal of the dielectric material occurs at a second rate that is different than the first rate, where removing a portion of the dielectric material and a portion of the electrode layer forms an undulating surface below the barrier material. In some examples of the method and apparatus described above, the barrier material comprises WN, WSix, or WSiN and the metal layer for the access line comprises tungsten, tantalum, or molybdenum.

Figure 7:
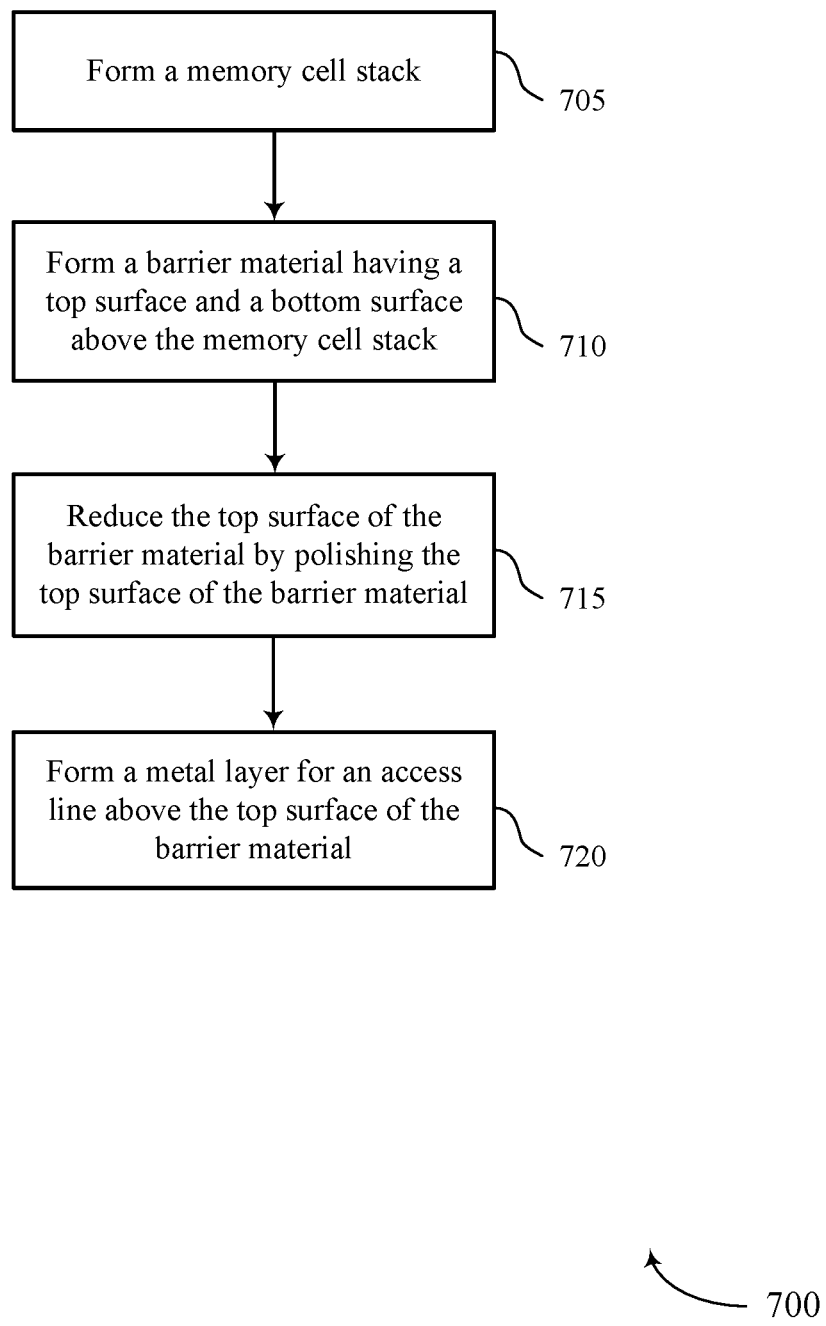

FIG. 7 shows a flowchart illustrating a method 700 for access line grain modulation in a memory device in accordance with embodiments of the present disclosure. The operations of method 700 may be implemented in accordance with various fabrication techniques as described herein. For example, the operations of method 700 may be implemented by the fabrication techniques as discussed with reference to FIGS. 1-5.

At 705 a memory cell stack may be formed. The operations of 705 may be performed according to the methods described herein. In certain examples, aspects of the operations of 705 may be using the fabrication techniques discussed with references to FIGS. 1-5.

At 710 a barrier material having a top surface and a bottom surface above the memory cell stack may be formed. The operations of 710 may be performed according to the methods described herein. In certain examples, aspects of the operations of 710 may be performed using the fabrication techniques discussed with reference to FIGS. 1-5.

At 715 the top surface of the barrier material may be reduced by polishing the top surface of the barrier material. The operations of 715 may be performed according to the methods described herein. In certain examples, aspects of the operations of 715 may be performed using the fabrication techniques discussed with reference to FIGS. 1-5.

At 720 a metal layer for an access line may be formed above the top surface of the barrier material. The operations of 720 may be performed according to the methods described herein. In certain examples, aspects of the operations of 720 may be performed using the fabrication techniques discussed with reference to FIGS. 1-5.

In some examples, an apparatus may perform aspects of the fabrication described using general-purpose or special-purpose hardware. The apparatus may include features, means, or instructions for forming a memory cell stack. The apparatus may additionally include features, means, or instructions for forming a barrier material having a top surface and a bottom surface above the memory cell stack. The apparatus may further include features, means, or instructions for reducing the top surface of the barrier material by polishing the top surface of the barrier material. The apparatus may further include features, means, or instructions for forming a metal layer for an access line above the top surface of the barrier material.

Some examples of the method and apparatus described above may further include processes, features, means, or instructions for etching a top surface of an electrode layer of the memory cell stack. Some examples of the method and apparatus described above may further include processes, features, means, or instructions for etching a top surface of a dielectric material interposed between the electrode layer and a second memory cell stack. Some examples of the method and apparatus described above may further include processes, features, means, or instructions for forming an undulating surface based at least in part on etching the top surface of the electrode layer and etching the top surface of the dielectric material.

Some examples of the method and apparatus described above may further include processes, features, means, or instructions for forming the barrier material on top of the undulating surface. In some examples of the method and apparatus described above, forming the barrier material may include forming an interface between an electrode layer of the memory cell stack and the bottom surface of the barrier material, wherein the interface has an undulation pattern. In some examples of the method and apparatus, reducing the top surface of the barrier material may include changing the barrier material from having a uniform thickness to having a varied thickness by applying a CMP process to the top surface of the barrier material.

It should be noted that the methods described above describe possible implementations, and that the operations and the steps may be rearranged or otherwise modified and that other implementations are possible. Further, embodiments from two or more of the methods may be combined.

In some cases, a device, system, or apparatus fabricated in accordance with various fabrication techniques as described herein may include a memory cell stack in a cross-point memory array, the memory cell stack comprising a storage element, a barrier material disposed above the memory cell stack, the barrier material comprising a planarized top surface, and a metal layer for an access line in contact with the planarized top surface of the barrier material.

In some examples of the device, system, or apparatus described above, the barrier material may comprise an undulating bottom surface. In some cases, the barrier material may have a first thickness in a first region above the memory cell stack and the barrier material may have a second thickness in a second region, where the second region is interposed between the first region and a third region that is above a second memory cell stack.

In some examples, the device, system, or apparatus may further include a dielectric material surrounding the memory cell stack, where the dielectric material has a top surface in contact with the barrier material, wherein the second region is above the dielectric material. In some cases of the device, system, or apparatus described above, the second thickness may be less than the first thickness.

In some examples, the barrier material may comprise a metal nitride such as WN, a metal silicide such as WSix, or a metal silicon nitride such as WSiN, and the metal layer may comprise a refractory metal such as tungsten, tantalum, or molybdenum. The device, system, or apparatus may also include an electrode layer within the memory cell stack, where the electrode layer has a top surface in contact with a bottom surface of the barrier material, wherein an interface between the top surface of the electrode layer and the bottom surface of the barrier material is separated from the metal layer by a varying distance. In some other examples, the electrode layer may comprise carbon.

In some examples, a center of the memory cell stack may be separated from a center of an immediately neighboring memory cell stack by a cell pitch distance. In some cases, the metal layer may have an average grain size greater than twice the cell pitch distance.

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory arrays.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), or platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   forming a set of materials for one or more memory cell stacks, wherein the set of materials comprises an electrode material, wherein the electrode material comprises a non-planar surface;
   forming, above the non-planar surface of the electrode material, a barrier material;
   planarizing a surface of the barrier material; and
   forming, in contact with the planarized surface of the barrier material, a material for an access line of a memory array.

2. The method of claim 1, wherein planarizing the surface of the barrier material comprises:
   polishing a top surface of the barrier material prior to forming the access line.

3. The method of claim 1, wherein planarizing the surface of the barrier material comprises:
   reducing a thickness of at least a portion of the barrier material prior to forming the access line.

4. The method of claim 1, wherein the barrier material is formed above an undulating surface.

5. The method of claim 1, wherein:
   the memory array comprises a cross-point memory array; and
   each of the one or more memory cell stacks comprises a respective storage element.

6. An apparatus, comprising:
   a set of memory cell stacks comprising an electrode layer within each memory cell stack of the set of memory cell stacks, wherein the electrode layer comprises a non-planar surface;
   a barrier material above the non-planar surface of the electrode layer, the barrier material comprising a planarized surface and an undulating surface; and an access line in contact with the planarized surface of the barrier material.

7. The apparatus of claim 6, wherein the planarized surface is a top surface of the barrier material.

8. The apparatus of claim 6, wherein the undulating surface is a bottom surface of the barrier material.

9. The apparatus of claim 6, wherein:
the set of memory cell stacks and the access line are included in a cross-point memory array.

10. The apparatus of claim 6,
wherein the electrode layer comprises carbon.

11. The apparatus of claim 10, further comprising:
a dielectric material interposed between each memory cell stack of the set of memory cell stacks.

12. The apparatus of claim 11, wherein the undulating surface of the barrier material is separated from the access line by a greater distance above the dielectric material than above respective electrode layers.

13. The apparatus of claim 6, wherein:
a center of a first memory cell stack of the set of memory cell stacks is separated from a center of a second memory cell stack of the set of memory cell stacks by a cell pitch distance; and
the access line has an average grain size greater than twice the cell pitch distance.

14. The apparatus of claim 6, wherein a first thickness of the barrier material above each memory cell stack of the set of memory cell stacks is different than a second thickness of the barrier material above a dielectric material, the dielectric material in between each memory cell stack of the set of memory cell stacks.

15. A method, comprising:
forming a set of materials for one or more memory cell stacks, wherein the set of materials comprises an electrode material, wherein the electrode material comprises a non-planar surface;
forming a barrier material above the non-planar surface of the electrode material;
polishing a top surface of the barrier material; and
forming, in contact with the polished top surface of the barrier material, a material for an access line.

16. The method of claim 15, wherein polishing the top surface of the barrier material comprises:
changing the barrier material from having a uniform thickness to having a varied thickness.

17. The method of claim 15, further comprising:
etching a top surface of the electrode material included in each of the one or more memory cell stacks; and
etching a top surface of a dielectric material interposed between two memory cell stacks of the one or more memory cell stacks.

18. The method of claim 17, further comprising:
forming an undulating surface based at least in part on etching the top surface of the electrode material and etching the top surface of the dielectric material.

19. The method of claim 18, wherein the barrier material is formed above the undulating surface.

20. The method of claim 15, wherein the barrier material is formed above an undulating surface.

* * * * *